United States Patent
Satake et al.

(10) Patent No.: US 8,754,661 B2
(45) Date of Patent: Jun. 17, 2014

(54) CAPACITIVE OCCUPANT SENSING APPARATUS

(75) Inventors: Masayoshi Satake, Okazaki (JP); Hiroyuki Mori, Obu (JP); Kouji Ootaka, Toyohashi (JP)

(73) Assignees: Denso Corporation, Kariya (JP); Nippon Soken, Inc., Nishio (JP)

( * ) Notice: Subject to any disclaimer, the term of this patent is extended or adjusted under 35 U.S.C. 154(b) by 410 days.

(21) Appl. No.: 13/313,317

(22) Filed: Dec. 7, 2011

(65) Prior Publication Data

US 2012/0146668 A1 Jun. 14, 2012

(30) Foreign Application Priority Data

Dec. 14, 2010 (JP) .................. 2010-278206

(51) Int. Cl.
*G01R 27/26* (2006.01)
*B60R 21/015* (2006.01)
*B60N 2/00* (2006.01)

(52) U.S. Cl.
CPC .......... *G01R 27/2605* (2013.01); *B60R 21/015* (2013.01); *B60N 2/002* (2013.01)
USPC .......................................... 324/686; 324/658

(58) Field of Classification Search
CPC ... B60N 2/002; B60R 21/015; G01R 27/2605
USPC .................................. 324/658, 686
See application file for complete search history.

(56) References Cited

U.S. PATENT DOCUMENTS

| | | | |
|---|---|---|---|
| 7,497,465 B2 * | 3/2009 | Wato et al. ................. | 280/735 |
| 8,040,241 B2 * | 10/2011 | Kamizono et al. ........... | 340/561 |
| 2008/0100425 A1 | 5/2008 | Kiribayashi | |

* cited by examiner

*Primary Examiner* — Amy He
(74) *Attorney, Agent, or Firm* — Harness, Dickey & Pierce, PLC (57) ABSTRACT

A control circuit identifies whether an occupant on a seat is an adult or a child based on a first capacitance between a first sensing electrode and a ground and a second capacitance between a second sensing electrode and the ground. The first capacitance is computed based on a value of an electric current, which is supplied to the first sensing electrode at the time of applying an oscillation signal from a signal application circuit to the first sensing electrode. The second capacitance is computed based on a value of an electric current, which is supplied to the second sensing electrode at the time of applying an oscillation signal from the signal application circuit to the second sensing electrode.

8 Claims, 5 Drawing Sheets

CAPACITIVE OCCUPANT SENSING APPARATUS

CROSS REFERENCE TO RELATED APPLICATION

This application is based on and incorporates herein by reference Japanese Patent Application No. 2010-278206 filed on Dec. 14, 2010.

BACKGROUND OF THE INVENTION

1. Field of the Invention

The present invention relates to a capacitive occupant sensing apparatus.

2. Description of Related Art

Various types of capacitive occupant sensing apparatuses have been proposed. For example, Japanese Unexamined Patent Publication No. 2008-111809A (corresponding to US2008/0100425A1) teaches a capacitive occupant sensing apparatus shown in FIGS. 9A and 9B, in which a sensing electrode 91 is placed in an inside of a seat 90 of a vehicle, and a guard electrode 92 is placed on a lower side of the sensing electrode 91. A sinusoidal signal (oscillation signal) is applied to the sensing electrode 91 to generate an electric field therearound, and a value of an electric current of the sinusoidal signal, which changes under influence of a conductive body and/or a dielectric body (e.g., a human body) located around the sensing electrode 91, is sensed. Then, according to this sensed result, a corresponding capacitance is computed, and it is determined whether an occupant on the seat 90 is an adult 93 or a child 94 present on a child-restraint system (CRS) based on this computed capacitance.

Figure 9A:
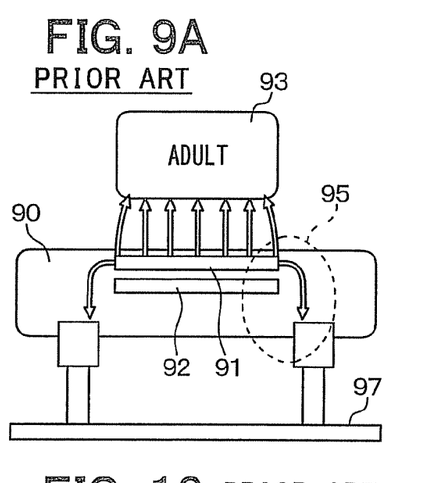
FIGS. 9A and 9B are schematic diagrams, showing a structure and an operation of a prior art capacitive occupant sensing apparatus.
Figure 9B:
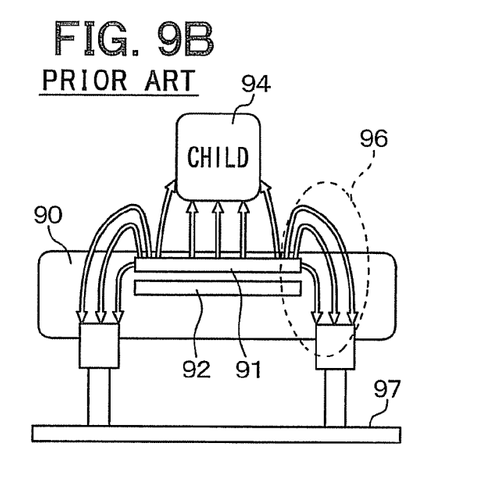

The electric field, which is generated from the electrode 91, is directly coupled not only with the sensing subject (adult or child) 93, 94 but also with a conductive body 97 (vehicle body), as indicated by circles 95, 96 in FIGS. 9A, 9B. Thereby, the sensed capacitance is increased by the amount, which corresponds to the direct coupling to the conductive body 97.

Figure 10:
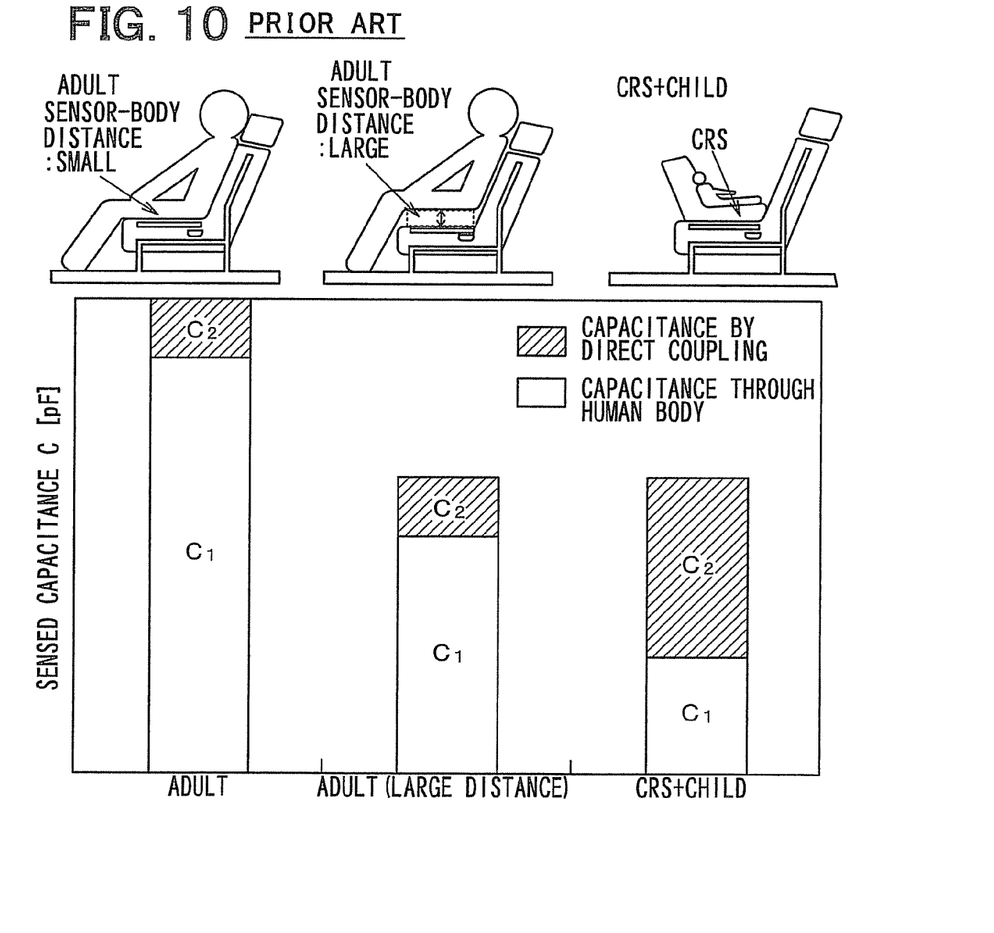
FIG. 10 is a diagram showing capacitances measured with the prior art capacitive occupant sensing apparatus.

FIG. 10 shows exemplary data indicating details of capacitances C1, C2 in each sensed capacitance for different cases (different occupants on the seat). In FIG. 10, the capacitance C1 is the capacitance through the human body, and the capacitance C2 is the capacitance increased by the direct coupling.

As shown in FIGS. 9A and 9B, a surface area of the electrode 91, which is covered with the child on the CRS, is smaller in comparison to the adult on the seat. Therefore, in a case where a distance between the electrode 91 and the body of the adult on the seat becomes large due to presence of a cushion between the adult and the seat and/or wearing of thick cloth(es), the capacitance C1 becomes smaller. As a result, in such a case, it is difficult to determine whether the occupant on the seat is the adult or the child on the CRS, as shown in FIG. 10.

SUMMARY OF THE INVENTION

The present invention addresses the above disadvantages. According to the present invention, there is provided a capacitive occupant sensing apparatus for identifying whether an occupant who is present on a seat of a vehicle is an adult or a child. The capacitive occupant sensing apparatus includes a sensor unit and a control unit. The sensor unit is installed to a seat base of the seat. The control unit is electrically connected to the sensor unit. The sensor unit includes a first sensing electrode and a second sensing electrode. The control unit includes a signal application circuit, a signal sensing circuit and a control circuit. The signal application circuit is adapted to apply an oscillation signal, which oscillates over time, to the first sensing electrode and is also adapted to apply an oscillation signal, which oscillates over time, to the second sensing electrode. The signal sensing circuit senses a value of an electric current, which is supplied to the first sensing electrode at time of applying the oscillation signal from the signal application circuit to the first sensing electrode, and a value of an electric current, which is supplied to the second sensing electrode at time of applying the oscillation signal from the signal application circuit to the second sensing electrode. The control circuit receives the values of the electric currents, which are supplied to the first sensing electrode and the second sensing electrode, respectively, and are sensed with the signal sensing circuit. The control circuit identifies whether the occupant on the seat is the adult or the child based on the values of the electric currents. The first sensing electrode is configured such that a hip breadth of a one year old infant dummy entirely covers a left-to-right directional length of the first sensing electrode, which is measured in a left-to-right direction of the seat, from a top side of the first sensing electrode in a state where the one year old infant dummy is present on a child-restraint system installed to the seat base in a normal upright seating position of the one year old infant dummy, in which the one year old infant dummy is centered about a center location of the first sensing electrode in the left-to-right direction of the seat. The second sensing electrode includes a right section and a left section located on a right side and a left side, respectively, of the first sensing electrode in the left-to-right direction of the seat. The right section and the left section of the second sensing electrode are configured such that the one year old infant dummy does not cover any portion of the right section and the left section of the second sensing electrode in the state where the one year old infant dummy is present on the child-restraint system installed to the seat base in the normal upright seating position of the one year old infant dummy, in which the one year old infant dummy is centered about the center location of the first sensing electrode in the left-to-right direction of the seat. The right section and the left section of the second sensing electrode are also configured such that an adult dummy covers at least a portion of the right section and at least a portion of the left section of the second sensing electrode from a top side of the second sensing electrode in a state where the adult dummy is present on the seat base in a normal upright seating position of the adult dummy, in which the adult dummy is centered about the center location of the first sensing electrode in the left-to-right direction of the seat. The one year old infant dummy is a CRABI 12-Month-Old Child, and the adult dummy is a Hybrid-III Female 5th percentile. The control circuit identifies whether the occupant on the seat is the adult or the child based on a first capacitance between the first sensing electrode and a ground and a second capacitance between the second sensing electrode and the ground. The first capacitance is computed based on the value of the electric current, which is supplied to the first sensing electrode at the time of applying the oscillation signal from the signal application circuit to the first sensing electrode, in view of a sensed result of the signal sensing circuit. The second capacitance is computed based on the value of the electric current, which is supplied to the second sensing electrode at the time of applying the oscillation signal from the signal application circuit to the second sensing electrode, in view of the sensed result of the signal sensing circuit.

According to the present invention, there is also provided a capacitive occupant sensing apparatus for identifying whether an occupant who is present on a seat of a vehicle is an adult or a child. The capacitive occupant sensing apparatus includes a sensor unit and a control unit. The sensor unit is installed to a seat base of the seat. The control unit is electrically connected to the sensor unit. The sensor unit includes a first sensing electrode and a second sensing electrode. The control unit includes a signal application circuit, a signal sensing circuit and a control circuit. The signal application circuit is adapted to apply an oscillation signal, which oscillates over time, to the first sensing electrode and is also adapted to apply an oscillation signal, which oscillates over time, to the second sensing electrode. The signal sensing circuit senses a value of an electric current, which is supplied to the first sensing electrode at time of applying the oscillation signal from the signal application circuit to the first sensing electrode, and a value of an electric current, which is supplied to the second sensing electrode at time of applying the oscillation signal from the signal application circuit to the second sensing electrode. The control circuit receives the values of the electric currents, which are supplied to the first sensing electrode and the second sensing electrode, respectively, and are sensed with the signal sensing circuit. The control circuit identifies whether the occupant on the seat is the adult or the child based on the values of the electric currents. A left-to-right directional length of the first sensing electrode, which is measured in a left-to-right direction of the seat, is equal to or smaller than 158 mm. The second sensing electrode includes a right section and a left section located on a right side and a left side, respectively, of the first sensing electrode in the left-to-right direction of the seat. A distance between the right section and the left section of the second sensing electrode measured in the left-to-right direction of the seat is equal to or larger than 174 mm and is equal to or smaller than 300 mm. The control circuit identifies whether the occupant on the seat is the adult or the child based on a first capacitance between the first sensing electrode and a ground and a second capacitance between the second sensing electrode and the ground. The first capacitance is computed based on the value of the electric current, which is supplied to the first sensing electrode at the time of applying the oscillation signal from the signal application circuit to the first sensing electrode, in view of a sensed result of the signal sensing circuit. The second capacitance is computed based on the value of the electric current, which is supplied to the second sensing electrode at the time of applying the oscillation signal from the signal application circuit to the second sensing electrode, in view of the sensed result of the signal sensing circuit.

BRIEF DESCRIPTION OF THE DRAWINGS

The invention, together with additional objectives, features and advantages thereof, will be best understood from the following description, the appended claims and the accompanying drawings in which:

DETAILED DESCRIPTION OF THE INVENTION (First Embodiment)

Figure 1:
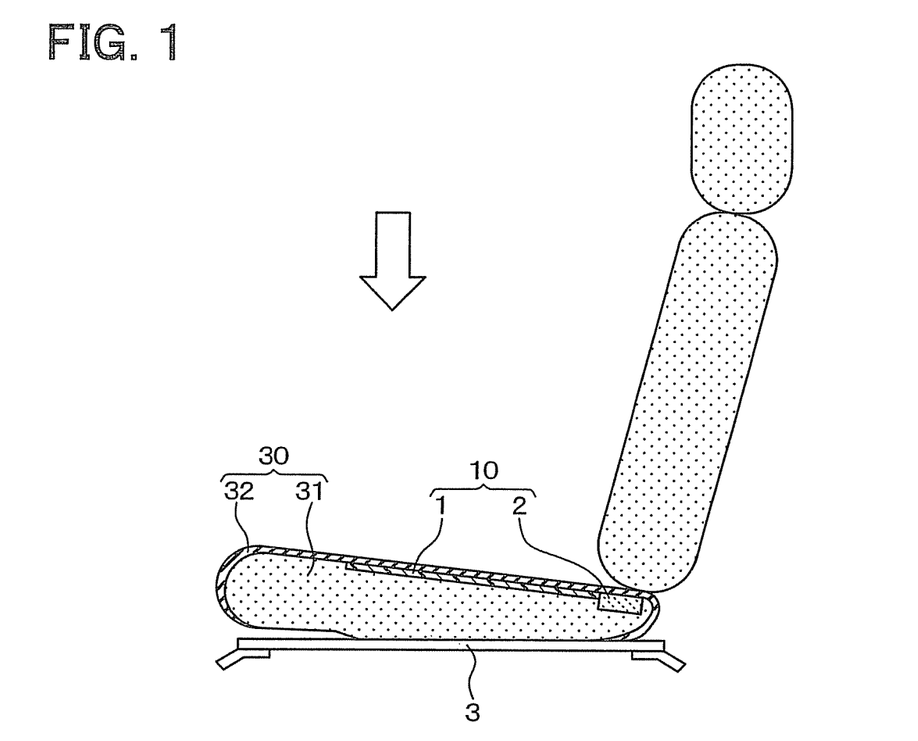
FIG. 1 is a schematic diagram showing a capacitive occupant sensing apparatus installed to a vehicle according to a first embodiment of the present invention.

Now, a first embodiment of the present invention will be described with reference to the accompanying drawings. FIG. 1 shows a capacitive occupant sensing apparatus 10 of the present embodiment installed in a vehicle (e.g., an automobile). The capacitive occupant sensing apparatus 10 is an apparatus, which is installed in the vehicle and identifies a type of an occupant who is seating on a seat (e.g., a front passenger seat, a rear seat) of the vehicle.

As shown in FIG. 1, the capacitive occupant sensing apparatus 10 includes a sensor unit 1 and a control unit 2. The sensor unit 1 is a film member, which is configured into a plate form and has a plurality of electrodes to sense the occupant who is present on the seat (e.g., the front passenger seat, the rear seat) of the vehicle. The sensor unit 1 is placed in a seat base 30 of the seat. More specifically, the sensor unit 1 is bonded to a seat cushion 31 at a location between the seat cushion 31 and a seat cover 32 in the seat base 30.

As shown in FIG. 1, the control unit 2 may be placed immediately below a seat back of the seat or may be placed at an outside of the seat. The control unit 2 is connected to an undepicted on-vehicle device (e.g., an air-bag ECU) through a sub-harness. An air-bag, an air-bag ON lamp and an air-bag OFF lamp are connected to the air-bag ECU.

Figure 2:
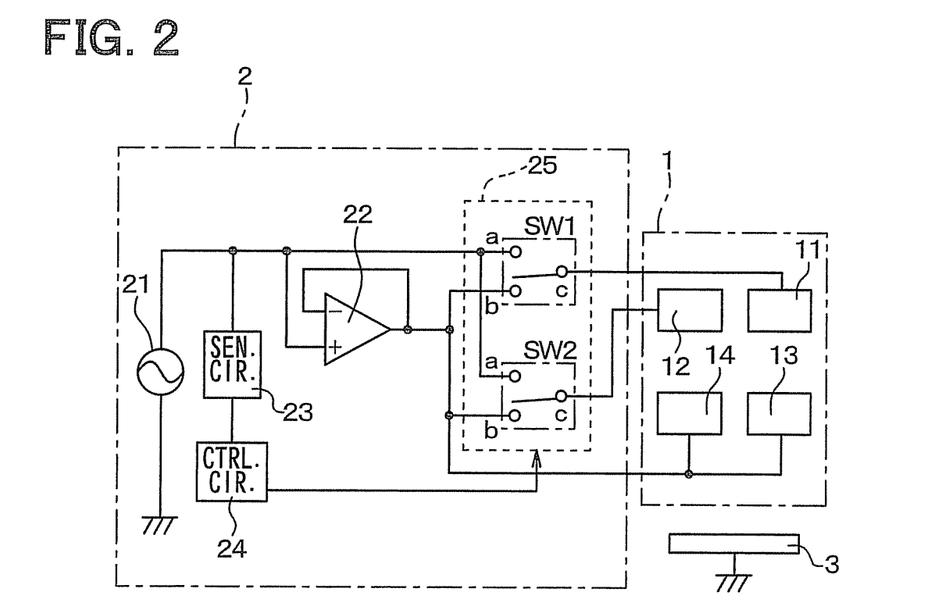
FIG. 2 is a schematic diagram showing a circuit structure of the capacitive occupant sensing apparatus of the first embodiment.

FIG. 2 shows a circuit structure of the capacitive occupant sensing apparatus 10. The sensor unit 1 includes a first sensing electrode 11, a second sensing electrode 12, a first back surface guard electrode 13 and a second back surface guard electrode 14. Details of the structure of the sensor unit 1 will be described with reference to FIGS. 3A to 3C.

Figure 3A:
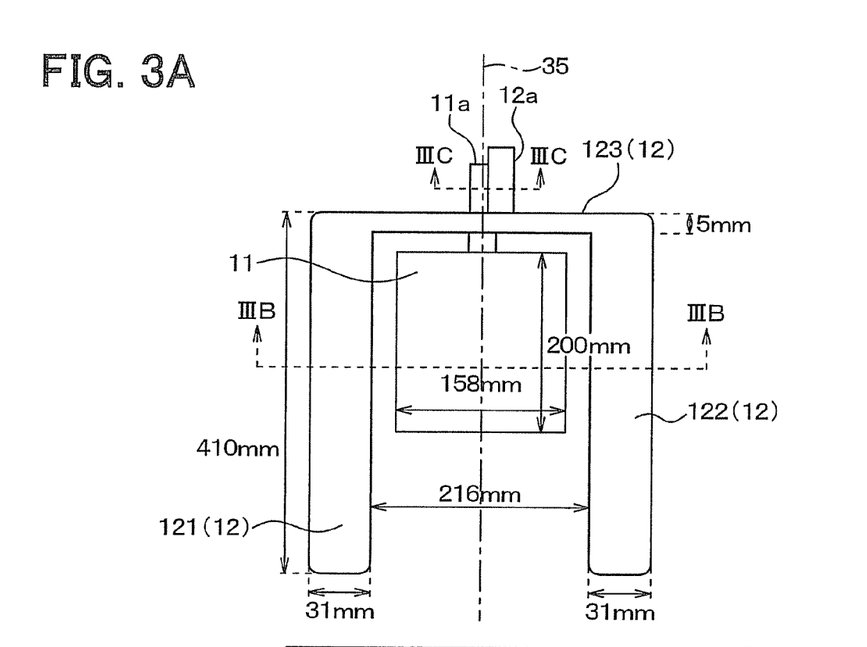
FIG. 3A is a schematic top view showing a first sensing electrode and a second sensing electrode of the capacitive occupant sensing apparatus of the first embodiment.
Figure 3B:
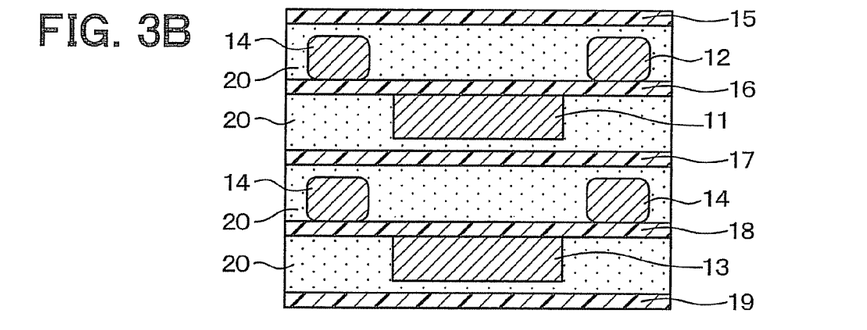
FIG. 3B is a cross-sectional view taken along line IIIB-IIIB in FIG. 3A.
Figure 3C:
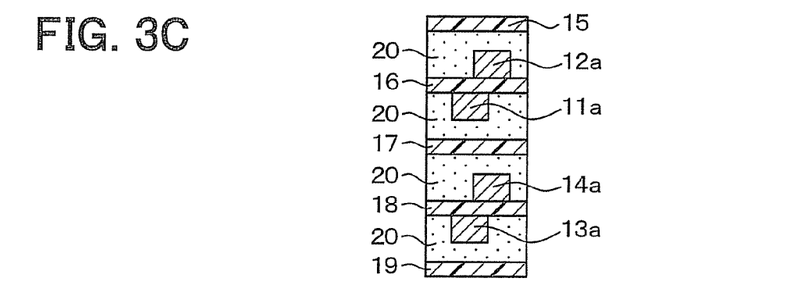
FIG. 3C is a cross-sectional view taken along line IIIC-IIIC in FIG. 3A.

FIG. 3A shows the sensor unit 1, which is installed to the seat base 30 and is seen from the top side of the sensor unit 1 (seen from a direction of an arrow in FIG. 1), showing the arrangement of the first and second sensing electrodes 11, 12 while eliminating the seat base 30 and the other components of the sensor unit 1 for the sake of simplicity. The lower side of FIG. 3A corresponds to a front side of the seat (a left side in FIG. 1). Furthermore, FIG. 3B is a cross-sectional view taken along line IIIB-IIIB in FIG. 3A, and FIG. 3C is a cross-sectional view taken along line IIIC-IIIC in FIG. 3A. A thickness of the sensor unit 1 measured in a top-to-bottom direction in FIGS. 3B and 3C is very thin (e.g., about 250 μm).

In FIGS. 3B and 3C, the thickness of the sensor unit 1, which is measured in the top-to-bottom direction in FIG. 3, is exaggerated from the actual size for purpose of improving the visibility.

As shown in FIG. 3A, the first sensing electrode 11 of the sensor unit 1 is a film member, which is configured into a plate form (planar form) and is generally placed at a center area of the seat base 30 in the view taken from the top side of the seat base 30. Specifically, the first sensing electrode 11 is configured into an oblong shape, i.e., a rectangular shape such that the front-to-rear directional length of the first sensing electrode 11, which is measured in the front-to-rear direction of the seat (the top-to-bottom direction in FIG. 3A), is 200 mm, and the left-to-right directional length of the first sensing electrode 11, which is measured in the left-to-right direction of the seat (the left-to-right direction in FIG. 3A), is 158 mm.

The left-to-right directional length of 158 mm at the first sensing electrode 11 coincides with the minimum value of the hip breadth of one year old infant dummy (specifically, CRABI 12-Month-Old Child). This size of 158 mm is set, so that the hip breadth of the one year old infant dummy entirely covers the left-to-right directional length of the first sensing electrode 11 from the top side thereof in the state where the one year old infant dummy is seating on a child-restraint system (CRS) 40 installed to the seat base 30 in a normal upright seating position of the one year old infant dummy, in which the one year old infant dummy is centered about a center location 35 of the first sensing electrode 11 in the left-to-right direction of the seat.

The first sensing electrode 11 is placed between the seat cushion 31 and the seat cover 32. Therefore, the front-to-rear directional length of the first sensing electrode 11 is the value, which is determined in view of various limitations, such as a shape, a length and a structure (e.g., a hanging position for fixing the seat surface sheet) of the seat base 30.

Furthermore, the second sensing electrode 12 is a film member, which is configured into a plate form (planar form). In a top view, which is taken from the upper side of the seat base 30, the second sensing electrode 12 is configured into a U-shape frame form, which covers the left side, the right side and the rear side of the first sensing electrode 11.

The size of the second sensing electrode 12 is set as follows. Specifically, the second sensing electrode 12 has a right section 121, a left section 122 and a rear section 123. The right section 121 is generally configured into an oblong form, i.e., a rectangular form and is placed on a right side of the first sensing electrode 11 in the left-to-right direction of the seat. The left section 122 is generally configured into an oblong form, i.e., a rectangular form and is placed on a left side of the first sensing electrode 11 in the left-to-right direction of the seat. Each of a front-to-rear directional length of the right section 121 and a front-to-rear directional length of the left section 122, which are measured in the front-to-rear direction of the seat, is set to 410 mm. Each of a left-to-right directional length (width) of the right section 121 and a left-to-right directional length (width) of the left section 122, which are measured in the left-to-right direction of the seat, is set to 31 mm. The rear section 123 is placed on a rear side of the first sensing electrode 11 in the front-to-rear direction of the seat and connects between the right section 121 and the left section 122 to electrically connect therebetween. A front-to-rear directional length of the rear section 123 is 5 mm, and a left-to-right directional length of the rear section 123 is 216 mm.

The rear section 123 does not have a substantial influence on the sensing of the occupant. This is due to the following two reasons. The first reason is that the rear section 123 is placed at a location adjacent to a connection between the seat base 30 and the seat back of the seat, so that the rear section 123 is more distant from the human body, i.e., the body of the occupant in comparison to the other sections 121, 122 of the second sensing electrode 12. The second reason is that the width (i.e., the front-to-rear directional length) of the rear section 123 is 5 mm and is thereby smaller than that of the right section 121 and the left section 122.

A left-to-right directional distance between the right section 121 and the left section 122 is set to 216 mm. This value of 216 mm coincides with a maximum value of a shoulder breadth of the one year old infant dummy. This size of 216 mm is set, so that the one year old infant dummy does not cover any portion of the right section 121 and the left section 122 of the second sensing electrode 12 in the state where the one year old infant dummy is seating on the CRS 40 installed to the seat base 30 in the normal upright seating position of the one year old infant dummy, in which the one year old infant dummy is centered about the center location 35 of the first sensing electrode 11 in the left-to-right direction of the seat.

With respect to this point, since the minimum value of the hip breadth is 174 mm, the required value of the left-to-right directional distance between the right section 121 and the left section 122 should be 174 mm or more. In the present embodiment, influences of the child movement and the locations of the hands of the child are taken into consideration, so that the maximum value of the shoulder breadth of the one year infant dummy is set to be 216 mm on the safe side.

Furthermore, the value of 216 mm is set, so that an adult dummy (specifically, Hybrid-III Female 5th percentile) covers at least a portion of the right section 121 and at least a portion of the left section 122 of the second sensing electrode 12 from the top side thereof in a state where the adult dummy is seating on the seat base 30 in a normal upright seating position of the adult dummy, in which the adult dummy is centered about the center location 35 of the first sensing electrode 11 in the left-to-right direction of the seat.

The second sensing electrode 12 is placed between the seat cushion 31 and the seat cover 32. Therefore, the front-to-rear directional length of the second sensing electrode 12 is the value, which is determined in view of the various limitations, such as the shape, the length and the structure (e.g., a hanging position for fixing the seat surface sheet) of the seat base 30.

Because of the above structure, a surface ratio between the first sensing electrode 11 and the second sensing electrode 12 in the exemplary case of FIG. 3A is set to be such that the surface area of the first sensing electrode 11: the surface area of the second sensing electrode 12=0.55:0.45.

The first back surface guard electrode 13 has the same size and the same shape as those of the first sensing electrode 11. The first back surface guard electrode 13 is spaced from and is opposed to the first sensing electrode 11 on the lower side of the first sensing electrode 11 (the back side of the plane of FIG. 3A), so that the first back surface guard electrode 13 is hidden by the first sensing electrode 11 and thereby cannot be seen in FIG. 3A. Similarly, the second back surface guard electrode 14 has the same size and the same shape as those of the second sensing electrode 12. The second back surface guard electrode 14 is spaced from and is opposed to the second sensing electrode 12 on the lower side of the second sensing electrode 12, so that the second back surface guard electrode 14 is hidden by the second sensing electrode 12 and thereby cannot be seen in FIG. 3A.

In the present embodiment, the electrodes 11-14 are made of a carbon material, which is electrically conductive. However, the electrodes 11-14 may be partially made of silver or may be entirely made of any other electrically conductive material.

In order to construct the electrodes 11-14 as a single mat having a plate form, the sensor unit 1 further includes a first film 15, a second film 16, a third film 17, a fourth film 18, a fifth film 19 and a bonding material 20.

The films 15-19 are dielectric films, which are configured into a plate form and are sized to cover the electrodes 11-14. Furthermore, the films 15-19 are made of polyethylene terephthalate (PET). The films 15-19 are arranged such that the films 15-19 are layered in this order from the top side to the bottom side. The second sensing electrode 12 is placed as a portion of a first layer between the first film 15 and the second film 16. The first sensing electrode 11 is placed as a portion of a second layer between the second film 16 and the third film 17. The second back surface guard electrode 14 is placed as a portion of a third layer between the third film 17 and the fourth film 18. The first back surface guard electrode 13 is placed as a portion of a fourth layer between the fourth film 18 and the fifth film 19.

These members 11-19 are joined together by the bonding material 20, which is filled in the first to fourth layers. The bonding material 20 is a dielectric material.

A connector 11a is formed integrally with the first sensing electrode 11 at a rear end portion of the first sensing electrode 11, which is located on a side where the rear end of the seat is located. The connector 11a is made of the material, which is the same as that of the first sensing electrode 11. A connector 12a is formed integrally with the second sensing electrode 12 at a rear end portion of the second sensing electrode 12, which is located on the side where the rear end of the seat is located. The connector 12a is made of the material, which is the same as that of the second sensing electrode 12. A connector 13a is formed integrally with the first back surface guard electrode 13 at a rear end portion of the first back surface guard electrode 13, which is located on the side where the rear end of the seat is located. The connector 13a is made of the material, which is the same as that of the first back surface guard electrode 13. A connector 14a is formed integrally with the second back surface guard electrode 14 at a rear end portion of the second back surface guard electrode 14, which is located on the side where the rear end of the seat is located. The connector 14a is made of the material, which is the same as that of the second back surface guard electrode 14. These connectors 11a-14a extend from the seat base 30 toward the rear side of the seat.

These connectors 11a-14a are connected to the control unit 2. Thereby, the electrodes 11-14 are electrically connected to the control unit 2 through the connectors 11a-14a.

As shown in FIG. 2, the control unit 2 includes a signal application circuit 21, a guard electric potential operational amplifier 22, a signal sensing circuit 23, a control circuit 24 and a switch device 25. The switch device 25 includes a first switch SW1 and a second switch SW2.

One signal line, which extends from the signal application circuit 21, is connected to the switch device 25. This signal line is branched in the switch device 25 and is connected to a terminal a of the first switch SW1 and a terminal a of the second switch SW2.

The first switch SW1 is a circuit that switches between a first state, in which the terminal a and a terminal c of the circuit of the first switch SW1 are connected with each other, and a second state, in which a terminal b and the terminal c of the circuit of the first switch SW1 are connected with each other. The terminal c of the first switch SW1 is connected to the first sensing electrode 11 through the connector 11a.

The second switch SW2 is a circuit that switches between a first state, in which the terminal a and a terminal c of the circuit of the second switch SW2 are connected with each other, and a second state, in which a terminal b and the terminal c of the circuit of the second switch SW2 are connected with each other. The terminal c of the second switch SW2 is connected to the second sensing electrode 12 through the connector 12a.

The signal application circuit 21 is a circuit that applies a signal to the terminal a of the first switch SW1 and the terminal a of the second switch SW2. This signal, which is applied from the signal application circuit 21, is an oscillation signal, which oscillates over time (more specifically, the voltage of the oscillation signal oscillates over time). In the present embodiment, the oscillation signal is a sinusoidal signal having a sine waveform. However, the oscillation signal is not limited to the sinusoidal signal and may be changed to an oscillation signal having, for example, a rectangular waveform, a triangular waveform or the like. An alternating current (AC) power source circuit or a signal generator circuit, which applies the oscillation signal (e.g., the sinusoidal signal), may be used as the signal application circuit 21. When the first switch SW1 is in the first state, this oscillation signal is applied to the first sensing electrode 11. When the second switch SW2 is in the first state, this oscillation signal is applied to the second sensing electrode 12.

A+input terminal of the guard electric potential operational amplifier 22 (serving as an example of a guard electric potential circuit) is connected to a signal line, which extends from the signal application circuit 21 to the switch device 25, i.e., which is finally connected to the terminal a of the first switch SW1 and the terminal a of the second switch SW2. An output terminal of the guard electric potential operational amplifier 22 is connected to the terminal b of the first switch SW1 and the terminal b of the second switch SW2. Furthermore, the output terminal of the guard electrode potential operational amplifier 22 is also connected to the first back surface guard electrode 13 through the connector 13a and is also connected to the second back surface guard electrode 14 through the connector 14a.

That is, the guard electric potential operational amplifier 22 serves as a voltage follower and applies a signal to the terminal b of the first switch SW1, the terminal b of the second switch SW2, the first back surface guard electrode 13 and the second back surface guard electrode 14. This signal, which is applied from the guard electric potential operational amplifier 22, has a phase and an electric potential that are the same as a phase and an electric potential of the oscillation signal applied from the signal application circuit 21 to the terminal a of the first switch SW1 and the terminal a of the second switch SW2. When the first switch SW1 is in the second state, this oscillation signal is applied to the first sensing electrode 11. When the second switch SW2 is in the second state, this oscillation signal is applied to the second sensing electrode 12.

The signal sensing circuit 23 is a circuit, which senses the electric current and the electric voltage of the signal line that extends from the signal application circuit 21 to the switch device 25. Thereby, at the time of applying the oscillation signal from the signal application circuit 21, the signal sensing circuit 23 senses a value of the electric current (current component) of the signal, which changes over time and is supplied from the signal application circuit 21 to the terminal a of the first switch SW1 and the terminal a of the second switch SW2, and also senses a value of the voltage (voltage component) of the signal, which changes over time and is applied from the signal application circuit 21 to the terminal a of the first switch SW1 and the terminal a of the second switch SW2. Any type of known circuit may be used as such a sensing circuit.

The control circuit 24 is a microcomputer of a known type and includes a CPU, a RAM and a ROM. The CPU executes a program stored in the ROM and uses the RAM as a work area to execute a process discussed below. The value of the electric current and the value of the voltage, which change over time and are sensed with the signal sensing circuit 23, are inputted to the control circuit 24.

Now, the operation of the capacitive occupant sensing apparatus 10 will be described. While a main power source (e.g., an ignition switch) is turned on, the signal application circuit 21 always outputs the oscillation signal to the terminal a of the first switch SW1 and the terminal a of the second switch SW2, and the control circuit 24 of the control unit 2 executes the program stored in the ROM, so that the control circuit 24 alternately changes a first occupant sensing mode and a second occupant sensing mode (periodically at, for example, every one second cycle).

Now, the first occupant sensing mode will be described. In the first occupant sensing mode, the control circuit 24 changes the first switch SW1 to the first state and also changes the second switch SW2 to the second state.

Thereby, the oscillation signal is applied from the signal application circuit 21 to the first sensing electrode 11. Also, the signal, which has the phase and the electric potential that are the same as the phase and the electric potential of the oscillation signal applied from the signal application circuit 21 to the first sensing electrode 11, is applied from the guard electric potential operational amplifier 22 to all of the second sensing electrode 12, the first back surface guard electrode 13 and the second back surface guard electrode 14.

At this time, the signal sensing circuit 23 senses the value of the electric current, which changes over time and is supplied from the signal application circuit 21 to the first sensing electrode 11, and the value of the voltage of the signal, which changes over time and is supplied from the signal application circuit 21 to the first sensing electrode 11, and the signal sensing circuit 23 outputs the sensed value of the electric current and the sensed value of the voltage of the signal to the control circuit 24. That is, the first sensing electrode 11 functions as the sensing electrode, and the second sensing electrode 12, the first back surface guard electrode 13 and the second back surface guard electrode 14 function as the guard electrodes, which limit the direct coupling between the first sensing electrode 11 and the vehicle body 3 without passing through the upper side of the seat base 30.

Furthermore, in the first occupant sensing mode, the control circuit 24 computes an impedance between the first sensing electrode 11 and the vehicle body (i.e., the ground) 3 based on a voltage amplitude, a current amplitude and a phase difference between the voltage and the current, which are determined based on the value of the electric current and the value of the voltage (also containing the phase information of the voltage and the electric current) that change over time and are sensed with the signal sensing circuit 23. Then, the control circuit 24 computes a capacitance (i.e., a capacitance between the first sensing electrode 11 and the vehicle body 3), which is proportional to an inverse of an imaginary part of the computed impedance. Thereafter, the control circuit 24 stores the computed capacitance as a first capacitance M1 in the RAM.

Next, the second occupant sensing mode will be described. In the second occupant sensing mode, the control circuit 24 changes the first switch SW1 to the second state and also changes the second switch SW2 to the first state.

Thereby, the oscillation signal is applied from the signal application circuit 21 to the second sensing electrode 12. Also, the signal, which has the phase and the electric potential that are the same as the phase and the electric potential of the oscillation signal applied from the signal application circuit 21 to the second sensing electrode 12, is applied from the guard electric potential operational amplifier 22 to all of the first sensing electrode 11, the first back surface guard electrode 13 and the second back surface guard electrode 14.

At this time, the signal sensing circuit 23 senses the value of the electric current, which changes over time and is supplied from the signal application circuit 21 to the second sensing electrode 12, and the value of the voltage of the signal, which changes over time and is supplied from the signal application circuit 21 to the second sensing electrode 12, and the signal sensing circuit 23 outputs the sensed value of the electric current and the sensed value of the voltage of the signal to the control circuit 24. That is, the second sensing electrode 12 functions as the sensing electrode, and the first sensing electrode 11, the first back surface guard electrode 13 and the second back surface guard electrode 14 function as the guard electrodes, which limit the direct coupling between the second sensing electrode 12 and the vehicle body 3 without passing through the upper side of the seat base 30.

Furthermore, in the second occupant sensing mode, the control circuit 24 computes an impedance between the second sensing electrode 12 and the vehicle body (i.e., the ground) 3 based on a voltage amplitude, a current amplitude and a phase difference between the voltage and the current, which are determined based on the value of the electric current and the value of the voltage (also containing the phase information of the voltage and the electric current) that change over time and are sensed with the signal sensing circuit 23. Then, the control circuit 24 computes a capacitance (i.e., a capacitance between the second sensing electrode 12 and the vehicle body 3), which is proportional to an inverse of an imaginary part of the computed impedance. Thereafter, the control circuit 24 stores the computed capacitance as a second capacitance M2 in the RAM.

The control circuit 24 alternately repeats the first occupant sensing mode and the second occupant sensing mode, and thereby the control circuit 24 alternately repeatedly records, i.e., stores the first capacitance M1 and the second capacitance M2. Then, for example, every time the second occupant sensing mode is completed, the control circuit 24 determines whether the occupant who is seating on the seat is the adult or the child present on the CRS based on the first capacitance M1, which is sensed in the latest first occupant sensing mode, and the second capacitance M2, which is sensed in the latest second occupant sensing mode.

Specifically, based on the first capacitance M1, which is sensed in the latest first occupant sensing mode, and the second capacitance M2, which is sensed in the latest second occupant sensing mode, the control circuit 24 computes a ratio of the first capacitance M1 over a sum of the first capacitance M1 and the second capacitance M2, i.e., computes the capacitance ratio of M1/(M1+M2). This capacitance ratio of M1/(M1+M2) is a derived value, which is derived from the first capacitance M1 and the second capacitance M2 and increases upon increasing of a ratio of the first capacitance M1 over the second capacitance M2, i.e., a ratio of M1/M2.

Then, the control circuit 24 compares the computed capacitance ratio of M1/(M1+M2) with a predetermined threshold value Th. When the capacitance ratio of M1/(M1+M2) is smaller than the threshold value Th, the control circuit 24 determines, i.e., identifies that the occupant is the adult. In contrast, when the capacitance ratio of M1/(M1+M2) is equal to or larger than the threshold value Th, the control circuit 24 determines, i.e., identifies that the occupant is the child on the CRS.

A principal of this identification of the occupant based on the first capacitance M1 and the second capacitance M2 will be described. As discussed above, the left-to-right directional length of the first sensing electrode 11, which is measured in the left-to-right direction of the seat, is set such that the hip breadth of the one year old infant dummy entirely covers the left-to-right directional length of the first sensing electrode 11 from the top side thereof in the state where the one year old infant dummy is seating on the CRS installed to the seat base 30 in the normal upright seating position of the one year old infant dummy, in which the one year old infant dummy is centered about the center location 35 of the first sensing electrode 11 in the left-to-right direction of the seat.

Figure 4:
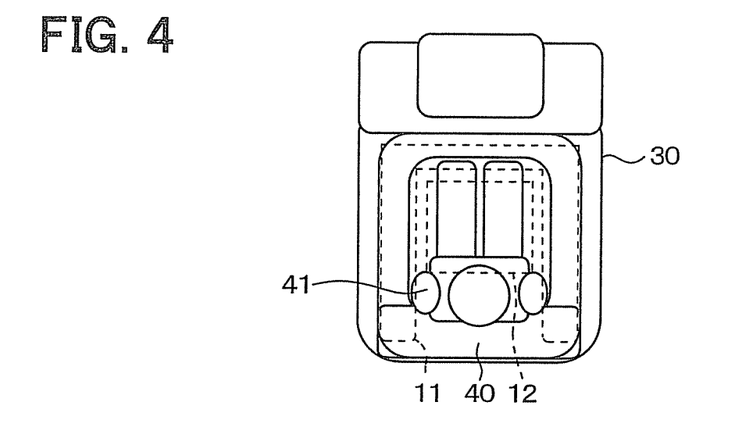
FIG. 4 is a schematic diagram showing a child present on a CRS installed to a seat base of the seat seen from a top side thereof.
Figure 5:
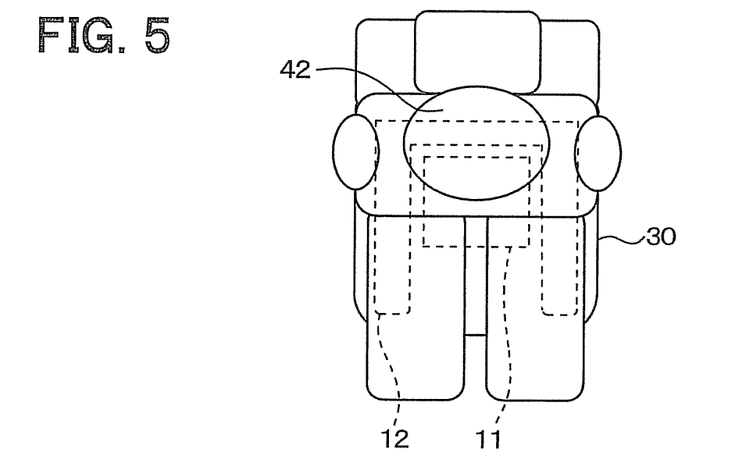
FIG. 5 is a schematic diagram showing an adult present on the seat base of the seat seen from the top side thereof.

Therefore, in most situations, in the case where the child 41 is present on the CRS 40 installed to the seat, the body of the child 41 entirely covers the left-to-right directional length of the first sensing electrode 11 from the top side thereof, as shown in FIG. 4. Also, in the case where the adult 42 is seating on, i.e., is present on the seat, the body of the adult 42 entirely covers the left-to-right directional length of the first sensing electrode 11 from the top side thereof, as shown in FIG. 5.

The left-to-right directional distance between the right section 121 and the left section 122 of the second sensing electrode 12 is set such that the one year old infant dummy does not cover any portion of the right section 121 and the left section 122 of the second sensing electrode 12 in the state where the one year old infant dummy is seating on the CRS 40 installed to the seat base 30 in the normal upright seating position of the one year old infant dummy, in which the one year old infant dummy is centered about the center location 35 of the first sensing electrode 11 in the left-to-right direction of the seat. Therefore, as shown in FIG. 4, in the case where the child 41 is present on the CRS 40 installed to the seat, the body of the child 41 does not cover the upper sides of the right section 121, the left section 122 and the rear section 123 of the second sensing electrode 12 in the most situations.

However, at the same time, the left-to-right directional distance between the right section 121 and the left section 122 of the second sensing electrode 12 is set such that the adult dummy (specifically, Hybrid-III Female 5th percentile) covers at least the portion of the right section 121 and at least the portion of the left section 122 of the second sensing electrode 12 from the top side thereof in the state where the adult dummy is seating on the seat base 30 in the normal upright seating position of the adult dummy, in which the adult dummy is centered about the center location 35 of the first sensing electrode 11 in the left-to-right direction of the seat. Therefore, as shown in FIG. 5, in the case where the adult 42 is present on the seat, the body of the adult 42 covers the upper side the right section 121 and the upper side of the left section 122 of the second sensing electrode 12 in many situations.

Figure 6:
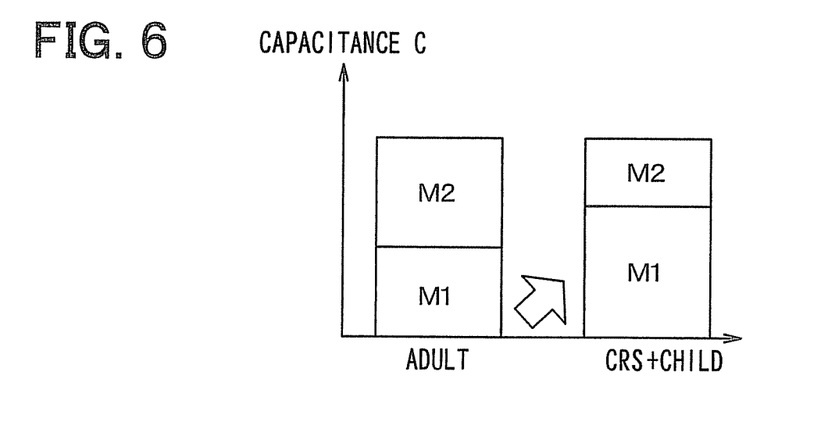
FIG. 6 is a diagram showing a first capacitance and a second capacitance for a case where the adult is present on the seat base of the seat and a case where the child is present on the CRS installed to the seat base of the seat.

Thereby, the relationship between the first capacitance M1 and the second capacitance M2 differs between the case where the adult is present on the seat and the case where the child is present on the CRS. As a result, as shown in FIG. 6, in a case where the body of the adult on the seat is spaced from the first and second sensing electrodes 11, 12 due to, for example, wearing of thick cloth(es), and thereby the sum of the first capacitance M1 and the second capacitance M2, which are sensed in this case where the adult is present on the seat, becomes equal to the sum of the first capacitance M1 and the second capacitance M2, which are sensed in the case where the child is present on the CRS installed to the seat, the derived value, which is based on the ratio of the first capacitance M1 and the second capacitance M2, i.e., the ratio of M1/M2, most likely differs between these cases. Therefore, the capacitance ratio of M1/(M1+M2), which is the function of the ratio of M1/M2, most likely differs between these cases.

Furthermore, even in the situation where the first capacitance M1, which is sensed in the case of the presence of the adult on the seat base 30, is substantially the same as the first capacitance M1, which is sensed in the case of the presence of the child on the CRS installed to the seat, the derived value, which is based on the ratio of the first capacitance M1 and the second capacitance M2, i.e., the ratio of M1/M2, most likely differs between these cases. Therefore, the capacitance ratio of M1/(M1+M2), which is the function of the ratio of M1/M2, most likely differs between these cases.

As discussed above, in view of the fact that the covered area of the seat, which is covered by the body of the adult, is different from the covered area of the seat, which is covered by the body of the child, the use of the two different electrodes, i.e., the first and second sensing electrodes 11, 12, which are placed at different locations, respectively, enables more accurate sensing of the adult on the seat or the child on the CRS in comparison to the prior art technique even in the case where the body of the adult on the seat is spaced from the first and second sensing electrodes 11, 12 due to the wearing of the thick cloth(es).

Figure 7:
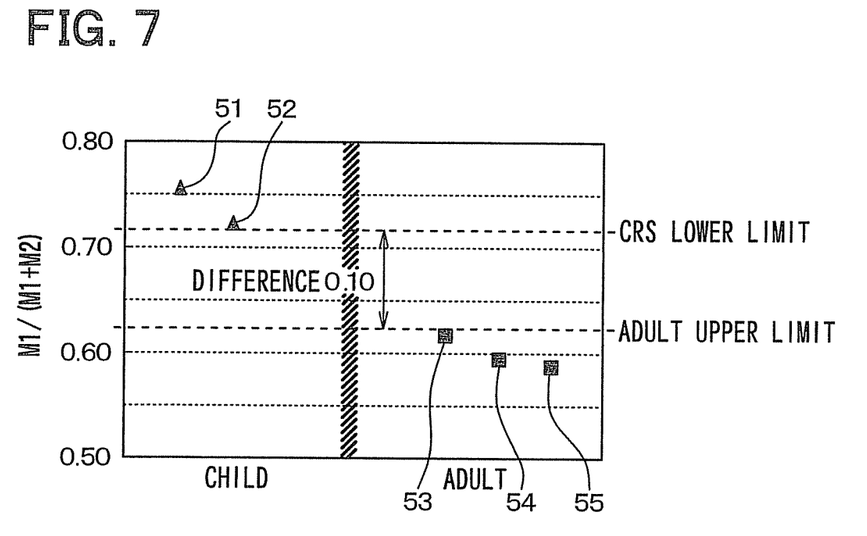
FIG. 7 is a diagram showing experimental results obtained by using the capacitive occupant sensing apparatus of the first embodiment.

FIG. 7 shows the capacitance ratio of M1/(M1+M2), which is derived from, i.e., is obtained based on the first capacitance M1 and the second capacitance M2 sensed with the capacitive occupant sensing apparatus 10 of the present embodiment for the one year old infant dummy and the adult dummy. More specifically, FIG. 7 shows plots of experimental results 51, 52 of the capacitance ratio of M1/(M1+M2) sensed in the state where the one year old infant dummy is present on the CRS installed to the seat. FIG. 7 also shows plots of experimental results 53, 54, 55 of the capacitance ratio of M1/(M1+M2) sensed in the state where the adult dummy is present on the seat. These experimental results 51, 52 are obtained by using the different types, respectively, of the CRS. Also, the experimental results 53-55 are obtained for the cases where the thickness of the cloth at the hip of the adult dummy differs. Specifically, the thickness of the cloth at the hip of the adult dummy increases toward the right side in FIG. 7, i.e., increases in the order of the experimental result 53, 54 and 55.

As indicated by these experimental results, since the one year old infant dummy on the CRS covers only the sensing electrode 11, the capacitance ratio of M1/(M1+M2) is high for the one year old infant dummy on the CRS. In contrast, since the adult dummy covers both of the first and second sensing electrodes 11, 12, the capacitance ratio of M1/(M1+M2) is low for the adult on the seat. Specifically, in the case where the one year old infant dummy is present on the CRS, the minimum value of the ratio of M1/(M1+M2) is about 0.7. In the case where the adult dummy is present on the seat, the minimum value of the ratio of M1/(M1+M2) is a close value (0.58-0.62), which is close to the surface ratio of 0.55.

Thus, a difference between the value of the ratio of M1/(M1+M2) for the one year old infant dummy on the CRS and the value of the ratio of M1/(M1+M2) for the adult dummy on the seat is equal to or larger than 0.10. Therefore, when a value (e.g., 0.65) in the range of 0.62 to 0.70 is used as the threshold value Th discussed above, it is possible to more accurately determine whether the human body on the seat base 30 is the adult or the child in comparison to the prior art technique.

Furthermore, in comparison to a second embodiment discussed below, the control unit 2 of the first embodiment is advantageous since it is only required to provide the single guard electric potential operational amplifier 22 and the single signal sensing circuit 23 in the control unit 2.

The determination result of the control circuit 24 (i.e., the determination result of whether the occupant on the seat is the adult on the seat or the child on the CRS) is outputted to the on-vehicle device, such as the air-bag ECU, discussed above. Then, the on-vehicle device executes various operations (e.g., a notifying operation) based on the outputted determination result. For example, in the case where the determination result is outputted to the air-bag ECU, which serves as the on-vehicle device, the following operation may be performed. Specifically, when the determination result indicates that the occupant on the seat is the adult, the air-bag ECU turns on the air-bag ON lamp. In contrast, when the determination result indicates that the occupant on the seat is the child on the CRS, the air-bag ECU turns on the air-bag OFF lamp. While the air-bag ON lamp is turned on, the air-bag ECU deploys the air-bag at the time of occurrence of collision of the vehicle. In contrast, while the air-bag OFF signal is turned on, the air-bag ECU does not deploy the air-bag even at the time of occurrence of collision of the vehicle.

(Second Embodiment)

Next, the second embodiment of the present invention will be described. The second embodiment differs from the first embodiment with respect to the structure of the control unit 2. Specifically, the control unit 2 of the second embodiment has the structure shown in FIG. 8. The specific structure of the control unit 2 is as follows.

Figure 8:
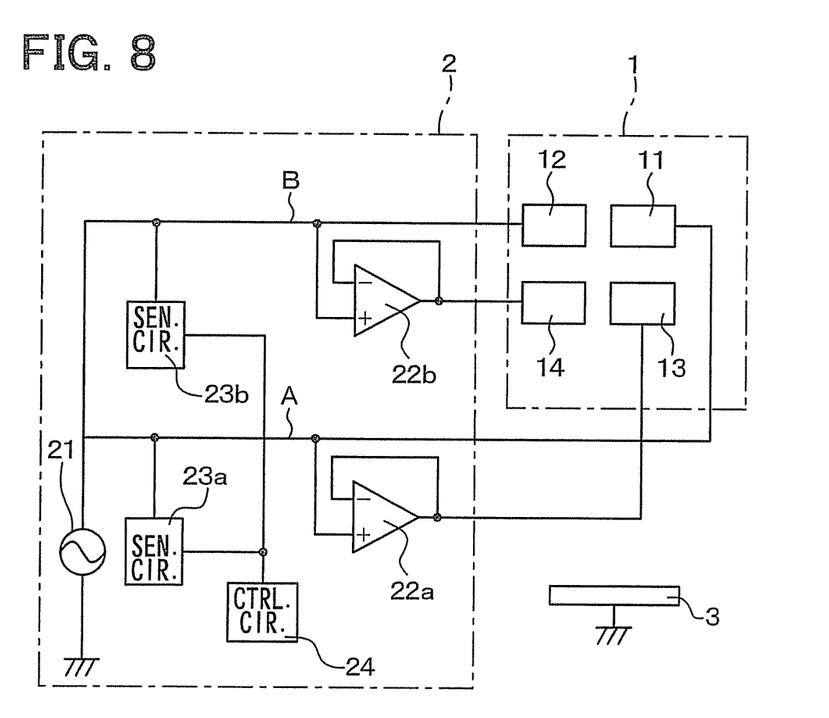
FIG. 8 is a schematic diagram showing a circuit structure of a capacitive occupant sensing apparatus according to a second embodiment of the present invention.

The control unit 2 includes the signal application circuit 21, a first guard electric potential operational amplifier 22*a*, a second guard electric potential operational amplifier 22*b*, a first signal sensing circuit 23*a*, a second signal sensing circuit 23*b* and the control circuit 24.

The structure of the signal application circuit 21 is the same as that of the signal application circuit 21 of the first embodiment. However, unlike the first embodiment, the signal application circuit 21 applies the oscillation signal only to the first sensing electrode 11 through the connector 11*a* and the second sensing electrode 12 through the connector 12*a*.

Specifically, a signal line, which extends from the signal application circuit 21 to the first sensing electrode 11 and the second sensing electrode 12, is branched at a branch point into two signal lines (first and second branched signal lines) A, B after the signal application circuit 21. The signal line (first branched signal line) A is connected to the first sensing electrode 11, and the signal line (second branched signal line) B is connected to the second sensing electrode 12.

A+input terminal of the first guard electric potential operational amplifier 22*a* (serving as one example of the guard electric potential circuit) is connected to the signal line A, which extends from the signal application circuit 21 to the first sensing electrode 11. An output terminal of the first guard electric potential operational amplifier 22*a* functions as a voltage follower, which is connected to the first back surface guard electrode 13 through the connector 13*a*.

A+input terminal of the second guard electric potential operational amplifier 22*b* (serving as one example of the guard electric potential circuit) is connected to the signal line B, which extends from the signal application circuit 21 to the second sensing electrode 12. An output terminal of the second guard electric potential operational amplifier 22*b* functions as a voltage follower, which is connected to the second back surface guard electrode 14 through the connector 14*a*.

The signal sensing circuit 23*a* is a circuit, which senses the electric current and the voltage at the signal line A to sense a value of the electric current, which changes over time and is supplied from the signal application circuit 21 to the first sensing electrode 11, and a value of the voltage, which changes over time and is applied from the signal application circuit 21 to the first sensing electrode 11. Any type of known circuit may be used as such a circuit.

The signal sensing circuit 23*b* is a circuit, which senses the electric current and the voltage at the signal line B to sense a value of the electric current, which changes over time and is supplied from the signal application circuit 21 to the second sensing electrode 12, and a value of the voltage of the signal, which changes over time and is applied from the signal application circuit 21 to the second sensing electrode 12. Any type of known circuit may be used as such a circuit. Also, the signal sensing circuit 23*a* and the single sensing circuit 23*b* may be collectively referred to as a signal sensing circuit.

The control circuit 24 is a microcomputer of a known type and includes a CPU, a RAM and a ROM. The CPU executes a program stored in the ROM and uses the RAM as a work area to execute a process discussed below. The value of the electric current and the value of the voltage, which change over time and are sensed with the first signal sensing circuit 23*a*, and the value of the electric current and the value of the voltage, which change over time and are sensed with the second signal sensing circuit 23*b*, are inputted to the control circuit 24.

Now, the operation of the capacitive occupant sensing apparatus 10 will be described. While the main power source (e.g., the ignition switch) is turned on, the signal application circuit 21 simultaneously outputs the oscillation signal to the first sensing electrode 11 and the second sensing electrode 12, and the control circuit 24 of the control unit 2 executes the program stored in the ROM, so that the control circuit 24 executes the operation in the occupant sensing mode.

In this way, the oscillation signal is applied from the signal application circuit 21 to the first sensing electrode 11, and the signal, which has the phase and the electric potential that are the same as the phase and the electric potential of the oscillation signal applied from the signal application circuit 21 to the first sensing electrode 11, is applied from the first guard electric potential operational amplifier 22*a* to the first back surface guard electrode 13.

At the same time, the oscillation signal is applied from the signal application circuit 21 to the second sensing electrode 12, and the signal, which has the phase and the electric potential that are the same as the phase and the electric potential of the oscillation signal applied from the signal application circuit 21 to the second sensing electrode 12, is applied from the second guard electric potential operational amplifier 22*b* to the second back surface guard electrode 14.

At this time, the first signal sensing circuit 23*a* senses the value of the electric current, which changes over time and is supplied from the signal application circuit 21 to the first sensing electrode 11, and the value of the voltage of the signal, which changes over time and is applied from the signal application circuit 21 to the first sensing electrode 11, and the first signal sensing circuit 23*a* outputs the sensed value of the electric current and the sensed value of the voltage of the signal to the control circuit 24. At the same time, the second signal sensing circuit 23*b* senses the value of the electric current, which changes over time and is supplied from the signal application circuit 21 to the second sensing electrode 12, and the value of the voltage of the signal, which changes over time and is applied from the signal application circuit 21 to the second sensing electrode 12, and the second signal sensing circuit 23*b* outputs the sensed value of the electric current and the sensed value of the voltage of the signal to the control circuit 24.

Thus, the first sensing electrode 11 and the second sensing electrode 12 simultaneously function as the different sensing electrodes, respectively, and the first back surface guard electrode 13 and the second back surface guard electrode 14 function as the guard electrodes, respectively, of the first sensing electrode 11 and the second sensing electrode 12.

The phase and the electric potential of the voltage, which is applied to the first sensing electrode 11, are substantially the same as the phase and the electric potential of the voltage, which is applied to the second sensing electrode 12. Therefore, the first sensing electrode 11 and the first back surface guard electrode 13 also function as the guard electrodes of the second sensing electrode 12 to some extent. Also, the second sensing electrode 12 and the second back surface guard electrode 14 also function as the guard electrodes of the first sensing electrode 11 to some extent.

Furthermore, in this occupant sensing mode, the control circuit 24 repeatedly computes an impedance between the first sensing electrode 11 and the vehicle body 3 based on a voltage amplitude, a current amplitude and a phase difference between the voltage and the current, which are determined based on the value of the electric current and the value of the voltage (also containing the phase information of the voltage and the electric current) that change over time and are sensed with the first signal sensing circuit 23a. Then, the control circuit 24 computes a capacitance (a capacitance between the first sensing electrode 11 and the vehicle body 3), which is proportional to an inverse of an imaginary part of this computed impedance. Thereafter, the control circuit 24 stores this computed capacitance as a first capacitance M1 in the RAM.

Also, the control circuit 24 repeatedly computes an impedance between the second sensing electrode 12 and the vehicle body 3 based on a voltage amplitude, a current amplitude and a phase difference between the voltage and the current, which are determined based on the value of the electric current and the value of the voltage (also containing the phase information of the voltage and the electric current) that change over time and are sensed with the second signal sensing circuit 23b. Then, the control circuit 24 computes a capacitance (a capacitance between the second sensing electrode 12 and the vehicle body 3), which is proportional to an inverse of an imaginary part of this computed impedance. Thereafter, the control circuit 24 stores this computed capacitance as a second capacitance M2 in the RAM.

Furthermore, the control circuit 24 periodically determines whether the occupant on the seat is the adult or the child on the CRS based on the latest first capacitance M1 and the latest second capacitance M2, which are recorded most lately at that moment.

Specifically, the control circuit 24 computes the capacitance ratio of M1/(M1+M2), i.e., the capacitance ratio of the first capacitance M1 over the sum of the first capacitance M1 and the second capacitance M2. Then, the control circuit 24 compares the computed capacitance ratio of M1/(M1+M2) with the predetermined threshold value Th. When the capacitance ratio of M1/(M1+M2) is smaller than the threshold value Th, the control circuit 24 determines, i.e., identifies that the occupant is the adult. In contrast, when the capacitance ratio of M1/(M1+M2) is equal to or larger than the threshold value Th, the control circuit 24 determines, i.e., identifies that the occupant is the child on the CRS. This threshold value Th may be the same as that of the first embodiment. This determination result of the control circuit 24 (i.e., the determination result of whether the occupant on the seat is the adult on the seat or the child on the CRS) is outputted to the on-vehicle device, such as the air-bag ECU, like in the first embodiment.

Thereby, according to the same principal as that of the first embodiment, in view of the fact that the covered area of the seat, which is covered by the body of the adult, is different from the covered area of the seat, which is covered by the body of the child, it is possible to more accurately sense the adult on the seat or the child on the CRS in comparison to the prior art technique even in the case where the body of the adult on the seat is spaced from the first and second sensing electrodes 11, 12 due to the wearing of the thick cloth(es).

Furthermore, in the present embodiment, the first sensing electrode 11 and the second sensing electrode 12 can simultaneously function as the different sensing electrodes, respectively. Therefore, the first capacitance M1 and the second capacitance M2 can be simultaneously sensed. Furthermore, unlike the first embodiment, it is not required to provide the switch device 25, which changes between the sensing mode for sensing the first capacitance M1 and the sensing mode for sensing the second capacitance M2. Thereby, according to the second embodiment, the structure of the capacitive occupant sensing apparatus 10 is simplified, and the processing operation at the control circuit 24 is eased.

The present invention is not limited to the above embodiments, and the above embodiments may be modified in various ways within a spirit and scope of the present invention. For example, the above embodiments may be modified as follows.

(1) In the above embodiments, the first sensing electrode 11 is configured into the rectangular shape such that the front-to-rear directional length of the first sensing electrode 11, which is measured in the front-to-rear direction of the seat, is 200 mm, and the left-to-right directional length of the first sensing electrode 11, which is measured in the left-to-right direction of the seat, is 158 mm. However, the configuration of the first sensing electrode 11 is not limited to this. The shape and the size of the first sensing electrode 11 are only required to satisfy the following condition, i.e., the hip breadth of the one year old infant dummy entirely covers the left-to-right directional length of the first sensing electrode 11 from the top side thereof in the state where the one year old infant dummy is present on the CRS installed to the seat base 30 in the normal upright seating position of the one year old infant dummy, in which the one year old infant dummy is centered about the center location 35 of the first sensing electrode 11 in the left-to-right direction of the seat.

Therefore, for example, the front-to-rear directional length of the first sensing electrode 11, which is measured in the front-to-rear direction of the seat, is not limited to 200 mm and may be changed to any other appropriate value based on the shape, the size and the structure (e.g., the hanging position for fixing the seat surface sheet) of the seat base 30. Furthermore, the left-to-right directional length of the first sensing electrode 11, which is measured in the left-to-right direction of the seat, is not limited to 158 mm and may be, for example, shorter than 158 mm. Also, the configuration of the first sensing electrode is not limited to the rectangular shape and may be changed to any other appropriate shape. In the case where the configuration of the first sensing electrode 11 is not rectangular shape, it is only required that a maximum value of the left-to-right directional length of the first sensing electrode 11, which is measured in the left-to-right direction of the seat, is equal to or smaller than 158 mm.

(2) The shape and the size of the second sensing electrode 12 are also not limited to the above described ones, which are discussed in the above embodiments. The location and the size of the second sensing electrode 12 are only required to satisfy the following condition, i.e., the one year old infant dummy does not cover any portion of the right section 121 and the left section 122 of the second sensing electrode 12 in the state where the one year old infant dummy is present on the CRS installed to the seat base 30 in the normal upright seating position of the one year old infant dummy, in which the one year old infant dummy is centered about the center location 35 of the first sensing electrode 11 in the left-to-right direction of the seat. As long as the above condition is satisfied, the advantages of the present invention can be sufficiently achieved.

Therefore, for example, the left-to-right directional distance between the right section 121 and the left section 122 is not limited to 216 mm. Specifically, the left-to-right directional distance between the right section 121 and the left section 122 is only required to be equal to or larger than 174 mm, which is the hip breath of the one year infant dummy. However, the location and the size of the second sensing electrode 12 needs to be set to satisfy the following condition of that the adult dummy (specifically, Hybrid-III Female 5th percentile) covers at least a portion of the right section 121 and at least a portion of the left section 122 of the second sensing electrode 12 from the top side thereof in the state where the adult dummy is present on the seat base 30 in the normal upright seating position of the adult dummy, in which the adult dummy is centered about the center location 35 of the first sensing electrode 11 in the left-to-right direction of the seat. In order to satisfy this condition, the left-to-right directional distance between the right section 121 and the left section 122 needs to be equal to or smaller than 300 mm, which is the minimum value of the hip breadth of the adult dummy.

(2) Also, the second sensing electrode 12 may be modified such that the second sensing electrode 12 includes only the right section 121 and the left section 122 and does not include the rear section 123. In such a case, two connectors extend from the right section 121 and the left section 122, respectively, and are connected to the control unit 2. However, in such a case, the number of the connectors is increased at the second sensing electrode 12. Therefore, it is required to increase the number of the terminals of the control unit 2, which are connected to the connectors of the second sensing electrode 12.

(3) Furthermore, in the above embodiments, the configuration of the sensing electrode 11, 12 is the rectangular shape. However, the configuration of the sensing electrode 11, 12 is not limited to the rectangular shape. For example, a notch(es) or recess(es) may be formed in the rectangular shape, or a hole(s) may be formed in the rectangular shape.

(4) In the above embodiments, the first sensing electrode 11 and the second sensing electrode 12 are placed at the different layers, respectively. Alternatively, the first sensing electrode 11 and the second sensing electrode 12 may be placed at a common layer. In such a case, the connectors 11a, 12a of the first and second sensing electrodes 11, 12 may be configured such that one of the connectors 11a, 12a extends into a different layer, which is other than the common layer having the first and second sensing electrodes 11, 12, and is pulled out from the different layer at the outside of the sensor unit 1 while the other of the connectors 11a, 12a extends out from the common layer.

(5) Furthermore, in the first embodiment, every time the second occupant sensing mode is completed, the control circuit 24 determines whether the occupant who is present on the seat is the adult or the child on the CRS based on the first capacitance M1, which is sensed in the latest first occupant sensing mode, and the second capacitance M2, which is sensed in the latest second occupant sensing mode. However, the timing of determining whether the occupant is the adult or the child on the CRS can be any other timing, which is repeated and is other than the timing after the completion of the second occupant sensing mode. Also, the first capacitance M1 and the second capacitance M2, which are used in this determination, are not necessarily the latest first capacitance M1 and the latest second capacitance M2. For example, the first capacitance M1, which is used in this determination, may be the first capacitance M1, which is obtained three times before the latest first capacitance M1, and the second capacitance M2, which is used in this determination, may be the second capacitance M2, which is obtained two times before the latest second capacitance M1. Alternatively, the first capacitance M1, which is used in this determination, may be an average of all of the previously sensed and stored first capacitances M1, and the second capacitance M2, which is used in this determination, may be an average of all of the previously sensed and stored second capacitances M1.

(6) Furthermore, in the second embodiment, the two guard electric potential operational amplifiers 22a, 22b are provided. Alternatively, these two guard electric potential operational amplifiers 22a, 22b may be integrated into a single guard electric potential operational amplifier. For example, the first guard electric potential operational amplifier 22a may be eliminated, and the output terminal of the second guard electric potential operational amplifier 22b may be connected to the first back surface guard electrode 13 in addition to the second back surface guard electrode 14. Even with this modification, the phase and the potential of the voltage applied to the first sensing electrode 11 are substantially the same as the phase and the potential of the voltage applied to the second sensing electrode 12. Therefore, the first back surface guard electrode 13 functions as the guard electrode for the first sensing electrode 11 to some extent.

Alternatively, the second guard electric potential operational amplifier 22b may be eliminated, and the output terminal of the first guard electric potential operational amplifier 22a may be connected to the second back surface guard electrode 14 in addition to the first back surface guard electrode 13. Even with this modification, the phase and the potential of the voltage applied to the first sensing electrode 11 are substantially the same as the phase and the potential of the voltage applied to the second sensing electrode 12. Therefore, the second back surface guard electrode 14 functions as the guard electrode for the second sensing electrode 12 to some extent. However, as in the second embodiment, when the two guard electric potential operational amplifiers 22a, 22b are provided, the functions of the first and second back surface guard electrodes 13, 14 as the guide electrodes can be improved.

(7) In the above embodiments, the guard electric potential operational amplifiers 22, 22a, 22b are used as the examples of the guard electric potential circuit that applies the signal, which has the phase and the electric potential that are the same as those of the oscillation signal applied to the sensing electrode 11, 12. However, the guard electric potential circuit of the present invention is not limited to the guard electric potential operational amplifier(s) and may be any other suitable type of device, which is other than the guard electric potential operational amplifier(s).

(8) In the above embodiments, the control circuit 24 determines whether the occupant on the seat is the adult or the child on the CRS based on the value of the electric current sensed with the signal sensing circuit 23, 23a, 23b. Also, the determination is not limited to the one for determining whether the occupant on the seat is the adult or the child on the CRS. For example, the determination may be one for determining whether the occupant on the seat (regardless of whether the occupant is present on the CRS or is seating directly on the seat) is the child or the adult.

That is, it is only required that the control circuit 24 determines whether the occupant on the seat of the vehicle is the child or the adult based on the value of the electric current sensed with the signal sensing circuit 23, 23a, 23b.

Also, the control circuit 24 may alternatively determine whether the seat of the vehicle is occupied by the child or the adult or is empty. In such a case, the first capacitance M1 and the second capacitance M2, which are used for determining whether the occupant on the seat of the vehicle is the child or the adult, may be used to compute the sum of the first capacitance M1 and the second capacitance M2, i.e., to compute the sum of M1+M2. Then, when the sum of M1+M2 is less than a reference value, the determination result, which indicates whether the occupant on the seat of the vehicle is the child or the adult, may be used. In contrast, when the sum of M1+M2 is equal to or larger than the reference value, it may be determined that the seat is empty regardless of the determination result, which indicates whether the occupant on the seat of the vehicle is the child or the adult.

(9) In the above embodiments, the guard electrodes 13, 14 may be eliminated, if desired. Even in such a case, the advantages discussed above can be achieved to some extent.

(10) Also, in the above embodiments, the capacitance ratio of M1/(M1+M2) is computed as the derived value, which increases as the ratio of M1/M2 increases. Then, the determination of the occupant is made based on the comparison of this capacitance ratio of M1/(M1+M2) with the threshold value. However, the derived value, which increases as the ratio of M1/M2 increases, may be any other value (e.g., the ratio of M1/M2), which is other than the capacitance ratio of M1/(M1+M2).

Furthermore, data, which separates between a determination range for determining that the occupant is the adult and a determination range for determining that the occupant is the child may be prestored in the ROM in a two dimensional parameter space of the first capacitance M1 and the second capacitance M2. Then, the determination of the occupant may be performed using this data and the computed first and second capacitances M1, M2.

(11) In the above embodiment, the control circuit 24 computes the impedance between the first sensing electrode 11 (or the second sensing electrode 12) and the vehicle body 3 based on the voltage amplitude, the current amplitude and the phase difference between the voltage and the current, which are determined based on the value of the electric current and the value of the voltage (also containing the phase information of the voltage and the electric current) that change over time and are sensed with the signal sensing circuit 23. Then, the control circuit 24 computes the capacitance, which is proportional to the inverse of the imaginary part of this computed impedance. Thereafter, the control circuit 24 stores this computed capacitance as the first capacitance M1 (or the second capacitance M2) in the RAM.

However, the computing method of the first capacitance M1 (or the second capacitance M2) is not limited to the above described one, which computes the first capacitance M1 (or the second capacitance M2) based on the value of the electric current and the value of the voltage (also containing the phase information of the voltage and the electric current) that change over time. For example, the value of the electric current, which is supplied from the signal application circuit 21 to the first sensing electrode 11 (or the second sensing electrode 12), may be sensed with the signal sensing circuit 23, and the first capacitance M1 (or the second capacitance M2) may be computed based solely on this value of the electric current.

That is, it is only required that the control circuit 24 computes the first capacitance M1 (or the second capacitance M2) based at least on the value of the electric current, which is supplied from the signal application circuit 21 to the first sensing electrode 11 (or the second sensing electrode 12).

(12) In the above embodiments, the functions, which are implemented by the execution of the program by the control circuit 24, may be achieved by using a hardware (e.g., a FPGA, which can program the circuit structure).

What is claimed is:

1. A capacitive occupant sensing apparatus for identifying whether an occupant who is present on a seat of a vehicle is an adult or a child, comprising:
  a sensor unit that is installed to a seat base of the seat; and
  a control unit that is electrically connected to the sensor unit, wherein:
  the sensor unit includes a first sensing electrode and a second sensing electrode;
  the control unit includes:
    a signal application circuit that is adapted to apply an oscillation signal, which oscillates over time, to the first sensing electrode and is also adapted to apply an oscillation signal, which oscillates over time, to the second sensing electrode;
    a signal sensing circuit that senses a value of an electric current, which is supplied to the first sensing electrode at time of applying the oscillation signal from the signal application circuit to the first sensing electrode, and a value of an electric current, which is supplied to the second sensing electrode at time of applying the oscillation signal from the signal application circuit to the second sensing electrode; and
    a control circuit that receives the values of the electric currents, which are supplied to the first sensing electrode and the second sensing electrode, respectively, and are sensed with the signal sensing circuit, wherein the control circuit identifies whether the occupant on the seat is the adult or the child based on the values of the electric currents;
  the first sensing electrode is configured such that a hip breadth of a one year old infant dummy entirely covers a left-to-right directional length of the first sensing electrode, which is measured in a left-to-right direction of the seat, from a top side of the first sensing electrode in a state where the one year old infant dummy is present on a child-restraint system installed to the seat base in a normal upright seating position of the one year old infant dummy, in which the one year old infant dummy is centered about a center location of the first sensing electrode in the left-to-right direction of the seat;
  the second sensing electrode includes a right section and a left section located on a right side and a left side, respectively, of the first sensing electrode in the left-to-right direction of the seat;
  the right section and the left section of the second sensing electrode are configured such that the one year old infant dummy does not cover any portion of the right section and the left section of the second sensing electrode in the state where the one year old infant dummy is present on the child-restraint system installed to the seat base in the normal upright seating position of the one year old infant dummy, in which the one year old infant dummy is centered about the center location of the first sensing electrode in the left-to-right direction of the seat;
  the right section and the left section of the second sensing electrode are also configured such that an adult dummy covers at least a portion of the right section and at least a portion of the left section of the second sensing electrode from a top side of the second sensing electrode in a state where the adult dummy is present on the seat base in a normal upright seating position of the adult dummy, in which the adult dummy is centered about the center location of the first sensing electrode in the left-to-right direction of the seat;

the one year old infant dummy is a CRABI 12-Month-Old Child, and the adult dummy is a Hybrid-III Female 5th percentile; and the control circuit identifies whether the occupant on the seat is the adult or the child based on:
- a first capacitance between the first sensing electrode and a ground, wherein the first capacitance is computed based on the value of the electric current, which is supplied to the first sensing electrode at the time of applying the oscillation signal from the signal application circuit to the first sensing electrode, in view of a sensed result of the signal sensing circuit; and
- a second capacitance between the second sensing electrode and the ground, wherein the second capacitance is computed based on the value of the electric current, which is supplied to the second sensing electrode at the time of applying the oscillation signal from the signal application circuit to the second sensing electrode, in view of the sensed result of the signal sensing circuit.

2. The capacitive occupant sensing apparatus according to claim 1, wherein:
- the control circuit compares a derived value, which is derived from the first capacitance and the second capacitance and increases upon increasing of a ratio of the first capacitance over the second capacitance, with a threshold value to identify whether the occupant on the seat is the adult or the child;
- when the derived value is smaller than the threshold value, the control circuit identifies that the occupant on the seat is the adult; and
- when the derived value is equal to or larger than the threshold value, the control circuit identifies that the occupant on the seat is the child.

3. The capacitive occupant sensing apparatus according to claim 1, further comprising a switch device that is adapted to switch between:
- a first occupant sensing mode, in which the switch device receives the oscillation signal from the signal application circuit and applies the received oscillation signal to the first sensing electrode; and
- a second occupant sensing mode, in which the switch device receives the oscillation signal from the signal application circuit and applies the received oscillation signal to the second sensing electrode;
- the signal sensing circuit senses the electric current, which is supplied from the signal application circuit to the switch device, so that the signal sensing circuit senses the value of the electric current, which is supplied from the signal application circuit to the first sensing electrode in the first occupant sensing mode, and the signal sensing circuit senses the value of the electric current, which is supplied from the signal application circuit to the second sensing electrode in the second occupant sensing mode; and
- the control circuit computes the first capacitance based on the value of the electric current, which is sensed with the signal sensing circuit in the first occupant sensing mode, and also computes the second capacitance based on the value of the electric current, which is sensed with the signal sensing circuit in the second occupant sensing mode.

4. The capacitive occupant sensing apparatus according to claim 1, wherein:
- a signal line extends from the signal application circuit and is branched at a branch point into a first branched signal line, which is connected to the first sensing electrode, and a second branched signal line, which is connected to the second sensing electrode;
- the signal sensing circuit includes:
  - a first signal sensing circuit that senses the electric current, which flows from the branch point to the first sensing electrode in the first branched signal line; and
  - a second signal sensing circuit that senses the electric current, which flows from the branch point to the second sensing electrode in the second branched signal line; and
- the first signal sensing circuit and the second signal sensing circuit are adapted to simultaneously sense the electric current in the first branched signal line and the electric current in the second branched signal line, respectively;
- the control circuit computes the first capacitance based on a value of the electric current, which is sensed with the first signal sensing circuit; and
- the control circuit computes the second capacitance based on a value of the electric current, which is sensed with the second signal sensing circuit.

5. A capacitive occupant sensing apparatus for identifying whether an occupant who is present on a seat of a vehicle is an adult or a child, comprising:
- a sensor unit that is installed to a seat base of the seat; and
- a control unit that is electrically connected to the sensor unit, wherein:
- the sensor unit includes a first sensing electrode and a second sensing electrode;
- the control unit includes:
  - a signal application circuit that is adapted to apply an oscillation signal, which oscillates over time, to the first sensing electrode and is also adapted to apply an oscillation signal, which oscillates over time, to the second sensing electrode;
  - a signal sensing circuit that senses a value of an electric current, which is supplied to the first sensing electrode at time of applying the oscillation signal from the signal application circuit to the first sensing electrode, and a value of an electric current, which is supplied to the second sensing electrode at time of applying the oscillation signal from the signal application circuit to the second sensing electrode; and
  - a control circuit that receives the values of the electric currents, which are supplied to the first sensing electrode and the second sensing electrode, respectively, and are sensed with the signal sensing circuit, wherein the control circuit identifies whether the occupant on the seat is the adult or the child based on the values of the electric currents;
- a left-to-right directional length of the first sensing electrode, which is measured in a left-to-right direction of the seat, is equal to or smaller than 158 mm;
- the second sensing electrode includes a right section and a left section located on a right side and a left side, respectively, of the first sensing electrode in the left-to-right direction of the seat;
- a distance between the right section and the left section of the second sensing electrode measured in the left-to-right direction of the seat is equal to or larger than 174 mm and is equal to or smaller than 300 mm; and
- the control circuit identifies whether the occupant on the seat is the adult or the child based on:

a first capacitance between the first sensing electrode and a ground, wherein the first capacitance is computed based on the value of the electric current, which is supplied to the first sensing electrode at the time of applying the oscillation signal from the signal application circuit to the first sensing electrode, in view of a sensed result of the signal sensing circuit; and a second capacitance between the second sensing electrode and the ground, wherein the second capacitance is computed based on the value of the electric current, which is supplied to the second sensing electrode at the time of applying the oscillation signal from the signal application circuit to the second sensing electrode, in view of the sensed result of the signal sensing circuit.

6. The capacitive occupant sensing apparatus according to claim 5, wherein:

the control circuit compares a derived value, which is derived from the first capacitance and the second capacitance and increases upon increasing of a ratio of the first capacitance over the second capacitance, with a threshold value to identify whether the occupant on the seat is the adult or the child;

when the derived value is smaller than the threshold value, the control circuit identifies that the occupant on the seat is the adult; and when the derived value is equal to or larger than the threshold value, the control circuit identifies that the occupant on the seat is the child.

7. The capacitive occupant sensing apparatus according to claim 5, further comprising a switch device that is adapted to switch between:

a first occupant sensing mode, in which the switch device receives the oscillation signal from the signal application circuit and applies the received oscillation signal to the first sensing electrode; and a second occupant sensing mode, in which the switch device receives the oscillation signal from the signal application circuit and applies the received oscillation signal to the second sensing electrode;

the signal sensing circuit senses the electric current, which is supplied from the single application circuit to the switch device, so that the signal sensing circuit senses the value of the electric current, which is supplied from the signal application circuit to the first sensing electrode in the first occupant sensing mode, and the signal sensing circuit senses the value of the electric current, which is supplied from the signal application circuit to the second sensing electrode in the second occupant sensing mode; and the control circuit computes the first capacitance based on the value of the electric current, which is sensed with the signal sensing circuit in the first occupant sensing mode, and also computes the second capacitance based on the value of the electric current, which is sensed with the signal sensing circuit in the second occupant sensing mode.

8. The capacitive occupant sensing apparatus according to claim 5, wherein:

a signal line extends from the signal application circuit and is branched at a branch point into a first branched signal line, which is connected to the first sensing electrode, and a second branched signal line, which is connected to the second sensing electrode;

the signal sensing circuit includes:

a first signal sensing circuit that senses the electric current, which flows from the branch point to the first sensing electrode in the first branched signal line; and a second signal sensing circuit that senses the electric current, which flows from the branch point to the second sensing electrode in the second branched signal line; and the first signal sensing circuit and the second signal sensing circuit are adapted to simultaneously sense the electric current in the first branched signal line and the electric current in the second branched signal line, respectively;

the control circuit computes the first capacitance based on a value of the electric current, which is sensed with the first signal sensing circuit; and the control circuit computes the second capacitance based on a value of the electric current, which is sensed with the second signal sensing circuit.

* * * * *